United States Patent
Kuniyasu

(10) Patent No.: US 6,268,230 B1
(45) Date of Patent: Jul. 31, 2001

(54) SEMICONDUCTOR LIGHT EMITTING DEVICE

(75) Inventor: Toshiaki Kuniyasu, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/421,324

(22) Filed: Oct. 18, 1999

(30) Foreign Application Priority Data

Oct. 16, 1998 (JP) .................................................. 10-295532

(51) Int. Cl.[7] .................................................... H01L 21/00
(52) U.S. Cl. .......................... 438/46; 438/47; 438/573; 438/574; 438/575; 438/580
(58) Field of Search ................................ 438/46, 47, 573, 438/574, 575, 580

(56) References Cited

U.S. PATENT DOCUMENTS 5,925,902 * 7/1999 Sakura .................................. 257/280

FOREIGN PATENT DOCUMENTS 8-172238   7/1996 (JP) .................................. H01S/3/18

* cited by examiner

*Primary Examiner*—Long Pham
(74) *Attorney, Agent, or Firm*—Sughrue, Mion, Zinn, Macpeak & Seas, PLLC

(57) ABSTRACT

By providing an area where an Au film 28b is removed and a Ti film 28a is exposed along the plane tangent to the side where the p-n junction of a semiconductor chip is exposed, sticking of the Au film 28b to the chip side or protruding of the film as a flash from the side is prevented, which normally provides a starting place for creep of a solder 42 on the chip side, which in turn causes p-n junction short-circuiting when dividing of chips.

4 Claims, 4 Drawing Sheets

SEMICONDUCTOR LIGHT EMITTING DEVICE

BACKGROUND OF THE INVENTION

1. Field of the Invention

The present invention relates to a semiconductor light emitting device, particularly to improvement of the electrode structure of a semiconductor chip constituting a semiconductor light emitting device.

2. Description of the Prior Art

A semiconductor light emitting device is generally configured by using solder to anchor an electrode, formed on the top of the stack structure of a semiconductor chip obtained by processing a stack structure comprising a semiconductor substrate and a p-n junction formed on the semiconductor substrate by epitaxial growth, to a metallic stem or mount constituting an electrode of a semiconductor device. The configuration is known as mounting in the junction-down style, because the stack layer structure side is anchored to the stem.

The electrode formed on the top of the stack structure of the semiconductor chip provides an electrode for the p-type region when the semiconductor substrate is of n-type, while, when the semiconductor substrate is of p-type, it provides an electrode for the n-type region. In either case, it generally has a stack structure comprising a metallic layer which provides ohmic contact with a p-type or n-type semiconductor and a metallic layer which is anchored to the stem.

The semiconductor chips are divided into generally square or rectangular individual chips in the state where they have the electrode metallic layer on the top, after completion of the processing including the semiconductor layer stacking process (generally known as wafer process) where the geometry of the semiconductor substrate is maintained, and further passed through processing (generally known as the assembling process, including a dividing process) before being completed as a semiconductor device. The dividing operation is performed from the top side of the electrode metallic layer by using a cutting tool such as a diamond saw, known as a dicer, for such a device as a light emitting diode, and for a semiconductor laser, by using a diamond stylus with an apparatus called a scriber, to draw marking-off lines (also called scribe lines) in a specified direction with a specified spacing, and then making cleavage of the semiconductor substrate along the marking-off line. For a semiconductor laser, the cleavage is made two times, the first cleavage (known as the primary cleavage) producing small long bars, with one of the opposed cleavage surfaces being coated with a high reflectivity film, while the other is coated with a low reflectivity film, then the secondary cleavage providing individual chips.

Therefore, for a semiconductor light emitting device, the operation of anchoring to the stem is performed in the state where at least one of the two opposed sides of the semiconductor chip is exposed, in other words, the p-n junction is exposed. The anchoring is performed by compression bonding the semiconductor chip to the metallic stem with solder, such as indium (In), being interposed between the electrode layer on the semiconductor chip side and the surface of the metallic stem, and heating and melting the solder to alloy it with the electrode layer.

Thus, the metal constituting the electrode layer on the side whereon the semiconductor chip is anchored to the stem must (1) be soft enough to allow it to be compression bonded to the stem through the solder, i.e., have a sufficiently high ductility, and (2) be able to be alloyed with the solder at a low temperature which will not deteriorate the electrical and optical characteristics of the semiconductor chip, and so gold (Au) is generally used.

After the semiconductor chip has been anchored, the solder may often irregularly spread along the side from the anchoring surface with the end of the spread solder extending linearly (which is generally called creep).

When the creep of the solder is caused on the side where the p-n junction is exposed, and the end of the creep reaches the p-n junction, the p-n junction is short-circuited. A semiconductor light emitting device is forward biased for operation, which means that short-circuiting of the p-n junction will not immediately cause the semiconductor light emitting device to be inoperative. However, because a part of the forward bias current to contribute to light emission flows through the solder which has crept, the ratio of the amount of light emission to the current flowing through the device, i.e., the light emission efficiency is lowered. Further, with a semiconductor laser, the laser oscillation threshold current is increased. In addition, if the p-n junction is short-circuited, the reverse field dielectric strength characteristic and various other electrical characteristics of the semiconductor light emitting device are deteriorated. When the values predetermined for the characteristics of a semiconductor light emitting device are not met, resulting from the deterioration of the light emission efficiency and the various electrical characteristics, and the increase of the laser oscillation threshold current, the semiconductor light emitting device is judged to be a defective item. In addition, for a semiconductor light emitting device which has been judged as only just acceptable, being in the state extremely close to the limits of the values, the probability of it offering unsatisfactory characteristics in a relatively short time is extremely high.

Thus, creep of the solder on the side of a semiconductor chip can reduce the yield (non-defective percentage) and the reliability of a semiconductor light emitting device.

As a configuration intended to prevent the reduction in yield and reliability due to creep of the solder, Sugo et al. (Japanese Unexamined Patent Publication No. 8(1996)-172238), for example, has disclosed a method of manufacturing a semiconductor laser device which, in the wafer process, provides a groove of approx. 3 $\mu$m in depth reaching the semiconductor substrate in an area where a scribe line for making the secondary cleavage would be drawn, and covers the sides and bottom of the groove with an insulating film. With the semiconductor laser chip according to this configuration, one of the two sets of opposed sides are coated with a high reflectivity film and a low reflectivity film as described above, and the remaining one is coated with an insulating film, thus, the p-n junction is not exposed on any sides, so if creep of the solder is caused in chip anchoring, the p-n junction will not be short-circuited, and thus reduction in yield and reliability of a semiconductor laser device will not occur.

By the way, the stack structure of a semiconductor laser device and other semiconductor light emitting devices comprises a few types of semiconductor layers which are generally different in composition from one another. When the groove is provided in the stack structure by chemical etching, the etching rate for a given etchant is not always uniform for semiconductors having different compositions, which means that the amount of etching varies for the layers, resulting in irregularities being produced on the sides of the groove provided. Especially when the stack structure includes an InGaP base layer and a GaAs or AlGaAs base layer, an etchant for GaAs or AlGaAs base layers cannot etch an InGaP base layer, which means a plurality of etchants must be used in the process of providing the groove, which results in the process being complicated, and in some cases, the irregularities on the sides of the groove being heavier. It is extremely difficult to completely cover the sides and bottom of the groove having irregularities on the sides with the insulating film. Especially for the areas which are invisible when viewed from the opening of the groove, it is practically impossible to cover them when the irregularities are heavy.

Use of a physical etching method, such as ion sputtering, can solve the above problem. However, physical etching is carried out at an extremely low speed, as compared to that for chemical etching, thus, to produce the groove having a depth of approx. 3 µm and a width of 100 µm or so to allow inserting the tip of a diamond stylus in the wafer surface as many times as required in parallel with a set spacing, it takes a long time. In other words, physical etching is feasible, but not easy to realize.

That is to say, the above structure offers the possibility of preventing the reduction in yield and reliability of a semiconductor light emitting device due to a creep of the solder, but is not easy to realize.

In the current situation wherein the semiconductor light emitting device is widely used in large quantities not only in industrial applications, but also in public welfare applications, there is a strong demand for reduction of the manufacturing cost and improvement of the reliability. Therefore, a highly feasible technique which can prevent short-circuiting of the p-n junction due to a creep of the solder, and thus can prevent the reduction in yield and reliability of a semiconductor light emitting device is very much in demand.

One of the reasons why the Au film is generally used as an electrode metallic layer on the side whereon the semiconductor chip is anchored to the stem is that it has an extremely high ductility, as stated above. Therefore, the Au film can easily be spread in cutting with a diamond saw or marking-off and cleavage with a diamond stylus in the dividing operation. Thus, after the dividing operation, the spread Au film may often become stuck to the side of the semiconductor chip or protrude as a flash from the side. Further, it has been already confirmed that, in anchoring of the semiconductor chip, the solder creeps, starting at a place where the Au film sticks to the chip side or protrudes as a flash from the side.

The above problems cannot be solved if a metallic film other than Au is selected as the electrode metallic layer on the side whereon the semiconductor chip is anchored to the stem. This is because, resulting from the high ductility, which is the primary criterion in selecting the electrode metallic layer on the side on which the semiconductor chip is anchored to the stem, it is not possible to avoid the electrode film sticking to the side of the semiconductor chip or protruding as a flash from the side in the dividing operation, and further, low temperature alloying of the electrode film with the solder, which is the secondary criterion for selection, causes the solder to creep, starting at a place where the electrode film sticks to the side or protrudes as a flash from the side.

The semiconductor light emitting device according to the present invention comprises a semiconductor stack portion wherein a plurality of semiconductor layers are stacked; a second metallic layer which contacts at least a part of the top of the semiconductor stack portion; and a first metallic layer which contacts the second metallic layer; wherein at least a part of the outer edge of the first metallic layer is located inside the outer edge of the second metallic layer, and an area where the top of the second metallic layer is exposed is provided outside the outer edge of the first metallic layer.

It is preferable that the second metallic layer comprise a high-melting point metal, or be made by stacking a plurality of metallic layers, and at least the topmost layer of the stack metal layer is a high-melting point metallic layer.

It is preferable that the high-melting point metal be any one of platinum (Pt), titanium (Ti), molybdenum (Mo), and tungsten (W).

The effects of the present invention will be described with an Au film being used as a typical example of an electrode metallic layer on the side on which the semiconductor chip is anchored to the stem.

According to the structures of the present invention, an area where the Au film does not exist can be provided along the plane tangent to, at least, the side where the p-n junction is exposed, of the semiconductor chip for a semiconductor light emitting device. Therefore, in dividing of semiconductor chips, the diamond stylus or diamond saw will not touch the Au film, and thus the Au film will not be spread. Thus, after the dividing operation, sticking of the Au layer to the side where the p-n junction is exposed or protruding of it as a flash from the side is not observed, and in anchoring, creep of the solder starting at a place where the Au film sticks to the side or protrudes as a flash from the side will not be caused.

Further, according to the structures of the present invention, the Au film is provided contacting a part of the top of the second metallic layer contacting the top of the semiconductor stack portion, so that in the areas where the Au film is not applied, the top of the second metallic layer is exposed, which means that deterioration of the characteristics of a semiconductor light emitting device due to the solder coming into direct contact with the semiconductor stack top to heat it when anchoring the semiconductor chip will not be caused.

Partial removal of the Au layer can be easily achieved by using the conventional technique which is based on photolithography and chemical etching.

With the structures of the present invention, the second metallic layer will be reliably cut with a diamond saw or a diamond stylus in a dividing operation. Therefore, if the second metallic layer comprises a metal which is lower in ductility and less reactive in alloying with the solder than the Au film, there remains the possibility of short-circuiting of the p-n junction due to creep of the solder.

The above problem can be avoided by using, as the second metallic layer, a high-melting point metal which will not cause alloying reaction with the solder at the heating temperature in anchoring.

In addition, the metal which provides ohmic contact with a p-type or n-type semiconductor is not always a high-melting point metal or a metal having a high strength of bond to the Au film. However, by giving the second metallic layer a two-layer stack structure comprising a metallic layer which provides ohmic contact with the semiconductor and a high-melting point metal having a high strength of bond to both of the metallic layer and the Au film, creep of the solder can be prevented without causing peeling of the Au film.

When there is a need for the second metallic layer to have a tack structure of three layers or more to relieve the high internal stresses imposed on the high-melting point metallic layer and prevent peeling of the high-melting point metallic layer due to the high internal stresses, using, as the layer contacting the semiconductor, a metallic layer providing ohmic contact with the semiconductor, and a high-melting point metallic layer as the topmost layer can prevent creep of the solder in the anchoring operation.

As a high-melting point metal which will not cause an alloying reaction with the solder at the heating temperature in anchoring, platinum (Pt), titanium (Ti), molybdenum (Mo), and tungsten (W) are available.

SUMMARY OF THE INVENTION

The purpose of the present invention is to offer an improved electrode structure of the semiconductor chip which can be easily realized, eliminating the problem of the electrode film sticking to the side of the semiconductor chip or protruding as a flash from the side, thereby controlling creep of the solder on the side of the chip to allow prevention of a reduction of the yield and reliability of the semiconductor light emitting device.

BRIEF DESCRIPTION OF THE DRAWINGS

FIG. 1a shows a sectional structural drawing, viewed from the side coated with a reflection film, of a semiconductor chip constituting the laser device, and FIG. 1b shows a top view of the semiconductor chip. FIG. 1c shows a sectional schematic illustrating the state where the semiconductor chip is mounted on the stem in the junction-down style.

FIG. 2a shows a sectional structural drawing, viewed from the side coated with a reflection film, of a semiconductor chip constituting the laser device, and FIG. 2b shows a top view of the semiconductor chip.

FIG. 3a shows a sectional structural drawing, viewed from the side coated with a reflection film, of a semiconductor chip constituting the laser device, and FIG. 3b shows a top view of the semiconductor chip.

DESCRIPTION OF THE PREFERRED EMBODIMENTS

Figure 1A:
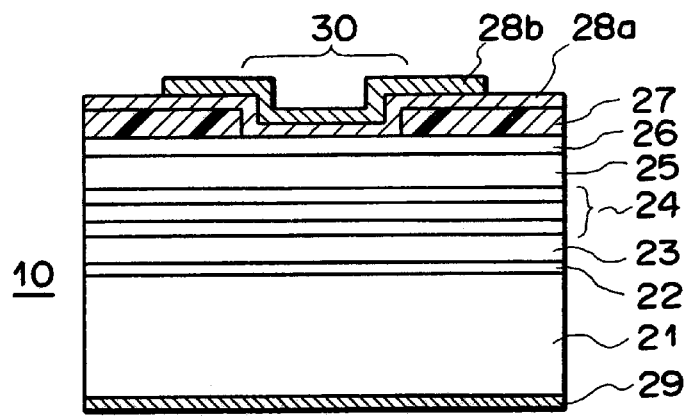
FIG. 1a to FIG. 1c show a set of drawings illustrating a gain waveguide type semiconductor laser device.
Figure 1B:
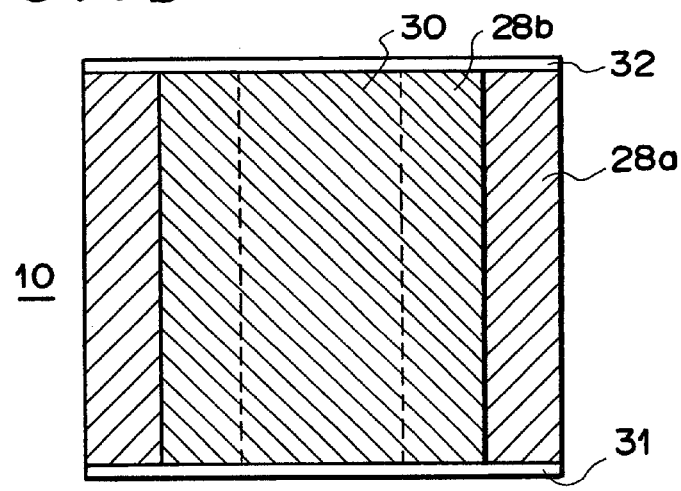
Figure 1C:
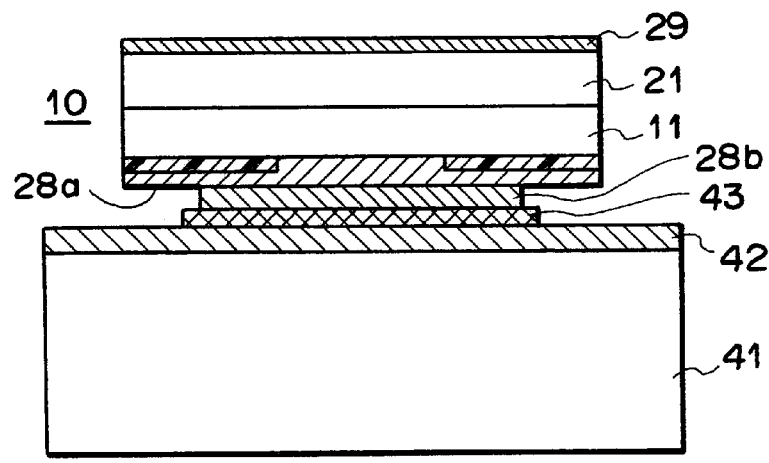

A first embodiment of the present invention will be explained with reference to FIG. 1a to FIG. 1c. FIG. 1a shows a sectional structural drawing, viewed from the side coated with a reflection film, of a semiconductor chip constituting a gain waveguide type semiconductor laser device embodying the present invention; FIG. 1b shows a plan structural drawing of the semiconductor chip viewed from the top; and FIG. 1c shows a sectional schematic view of a first embodiment of the present invention illustrating the state where the semiconductor chip is mounted on the stem in the junction-down style.

A semiconductor chip 10 was produced as follows. By the reduced pressure metal organic chemical vapor deposition (MOCVD) method, an n-GaAs buffer layer 22 of $1\times10^{18}$ $cm^{-3}$ in Si doping rate and 0.5 $\mu$m in thickness, an n-$Al_{0.5}Ga_{0.5}As$ cladding layer 23 of $1\times10^{18}$ $cm^{-3}$ in Si doping rate and 2.5 $\mu$m in thickness, an undoped SCH active layer 24, a p-$Al_{0.5}Ga_{0.5}As$ cladding layer 25 of $1\times10^{18}$ $cm^{-3}$ in Zn doping rate and 2 $\mu$m in thickness, and a p-GaAs cap layer 26 of $3\times10^{19}$ $cm^{-3}$ in Zn doping rate and 0.3 $\mu$m in thickness were stacked in sequence on an n-GaAs substrate 21 of $2\times10^{18}$ $cm^{-3}$ in Si doping rate. The SCH active layer 24 was provided with a layer configuration of an undoped $Al_{0.25}Ga_{0.75}As$ light-guiding layer of 0.05 $\mu$m in thickness, an undoped $Al_{0.05}Ga_{0.95}As$ quantum well of 8 nm in thickness, an undoped $Al_{0.25}Ga_{0.75}As$ light-guiding layer of 0.05 $\mu$m in thickness from the n-$Al_{0.5}Ga_{0.5}As$ cladding layer 23 side. After completion of stacking the semiconductor layers, an $SiO_2$ film 27 was stacked by the plasma CVD method, and the $SiO_2$ film 27 of 50 $\mu$m in width was removed by the photolithography method to form an electrode window 30. Then, a p-side electrode layer 28 which was produced by using the sputtering method to stack a Ti layer 28a and an Au layer 28b in sequence was subjected to heat treatment (generally known assintering or alloying) for 30 minutes at 400° C. to provide an ohmic electrode. Further, the Au layer 28b of 100 $\mu$m in width was, by the photolithography method, removed with an $I_2$-KI water solution about the secondary cleavage line to expose the Ti layer 28a. Then, the n-GaAs substrate 21 was polished until the entire thickness is 100 $\mu$m, and on the polished surface, an AuGe layer, an Ni layer and an Au layer were sequentially stacked by the vacuum deposition method to provide an n-side electrode 29, which was sintered at 350° C. to provide an ohmic electrode. Further, one of the opposed cleavage surfaces obtained by carrying out primary cleavage was coated with a low reflectivity film 31 having a reflectivity of 10% or less, while the other was coated with a high reflectivity film 32 having a reflectivity of 95% or more. Finally, along the center line of the Au layer 28b removed portion of 100 $\mu$m in width, secondary cleavage was performed to provide the semiconductor chip 10. The semiconductor stack portion 11 of the semiconductor chip 10 was compression bonded to a metallic stem 41 having an In layer 42 as a solder on the top and heated to form an alloy layer 43 of the Au layer 28b and the In layer 42 for anchoring the semiconductor chip 10 to the stem 41.

According to the present embodiment, a scribe line for secondary cleavage could be drawn with a diamond stylus without it touching the Au layer 28b. Therefore, sticking of the Au layer 28b to the side where the p-n junction of the semiconductor chip 10 is exposed or protruding of it as a flash from the side was not observed, and further, the surface exposed on the outside of the Au layer 28b is a Ti layer 28a surface, which will not be alloyed with the In solder 42 at the temperature in the compression bonding and heating, whereby there was no creep of the In solder 42 on the side where the p-n junction is exposed when mounting in the junction-down style. As a result of this, it has been possible to reduce the percentage of occurrence of p-n junction short-circuiting in mounting, which had been approximately 15%, to 0%.

In the present embodiment, In was used as the solder, but the same effects can be provided by using such a material as Sn and AuSn.

As the ohmic electrode layer for the p-GaAs, Ti was used, but by sintering in a temperature range which will not deteriorate the electrical and optical characteristics of the semiconductor chip, an ohmic contact can be provided, and any metal which will not make an alloy with the solder at the temperature in the compression bonding and heating can be used. Many such metals are generally known as high-melting point metals, and the high-melting point metals which have provided actual results are Pt, Mo, and W in addition to Ti.

As the n-side electrode, an AuGe—Ni—Au stack metallic layer was used. However, the present invention is not limited to this combination. For example, the AuGe layer can be replaced with a metallic or alloy layer which is capable of providing ohmic contact with the n-GaAs by sintering at a temperature lower than the sintering temperature for the p-side electrode. The Ni layer can be replaced with some other metal, preferably a high-melting point metal, which offers a high strength of bond to both of the metals to be in ohmic contact with the n-GaAs and the topmost metal (Au in this embodiment). Further, the Au layer as the topmost layer can be replaced with another metallic layer by the method of connecting the semiconductor laser device to an external n-side electrode. For example, when the light emission threshold current density is low, an Al film which allows an aluminum (Al) wire to be ultrasonically bonded to it can be used.

Figure 2A:
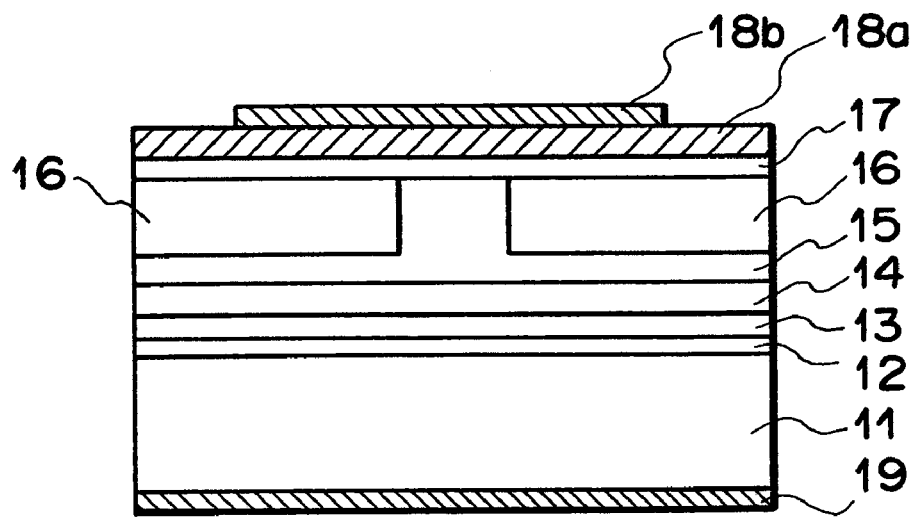
FIG. 2a and FIG. 2b show a set of drawings illustrating an embedded stripe type semiconductor laser device.
Figure 2B:
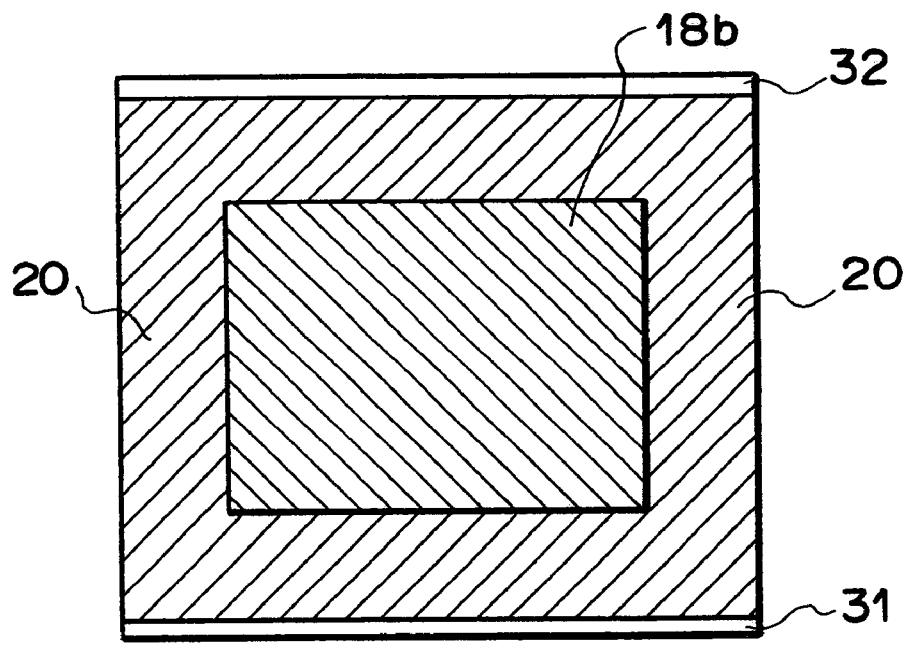

In the above description of the first embodiment, a gain waveguide type semiconductor laser device which is provided with an insulation stripe has been mentioned. However, also with a second embodiment in which the present invention is embodied as an embedded stripe type semiconductor laser device as shown in FIG. 2a and FIG. 2b, the effects similar to those of the above first embodiment can be obtained. Hereon, FIG. 2a shows a schematic sectional drawing viewed from the side coated with a reflection film, of a semiconductor chip constituting the embedded stripe type semiconductor laser device as an embodiment of the present invention, and FIG. 2b shows a top view of the semiconductor chip.

In FIG. 2a and FIG. 2b, 11 denotes an n-GaAs substrate, 12 an n-GaAs buffer layer, 13 an n-AlGaAs cladding layer, 14 an undoped SCH active layer, 15 a p-AlGaAs cladding layer, 16 an n-AlGaAs current constriction layer, and 17 a p-GaAs cap layer. The surface of the p-GaAs cap layer 17 is directly covered with a p-side electrode 18. A second metallic layer 18a of the p-side electrode 18 has a two-layer structure comprising a Ti layer-Pt layer from the side on which it makes contact with the p-GaAs cap layer 17, and an Au layer 18b as a first metallic layer covering a part of the Pt layer. The Pt layer has a high strength of bond to both of the Ti layer and the Au layer 18b, providing a metal which not only increases the strength of bond of the p-side electrode to the p-GaAs cap layer 17, but also will not be alloyed with the solder, such as In, Sn, and AuSn, at the heating temperature in mounting in the junction-down style. As can be seen from FIG. 2b, with the top of the semiconductor chip, the Au film 18b is also removed along the planes tangent to the sides coated with the low reflectivity film 31 and the high reflectivity film 32 in addition to the removal in the above first embodiment, with a surface 20 of the Pt film being exposed. Therefore, with the structure in the second embodiment, the diamond stylus will not come into contact with the Au film 18b in the primary and secondary cleavage operations. The advantages offered by preventing the diamond stylus from coming into contact with the Au film are as described above.

The primary cleavage surfaces are coated with a low reflectivity film and a high reflectivity film, respectively, which means the solder will not creep on the side in mounting in the junction-down style, and therefore there will be no reduction in yield and reliability due to deterioration of various electrical properties, an increase in threshold current for laser oscillation, or any other faulty characteristics. However, if the Au film sticks to the primary cleavage surface or protrudes from it as a flash, tight contact of the low reflectivity film or the high reflectivity film with the primary cleavage surface will be hindered. Poor contact of the low reflectivity film or the high reflectivity film with the primary cleavage surface can lower the functions of the low reflectivity film and the high reflectivity film in a semiconductor laser device, and thus has caused a reduction in yield. Further, the semiconductor laser device generates heat during operation, and so the thermal expansion-to-contraction cycle due to the operation start-to-operation stop cycle promotes the poor contact. Thus, if the poor contact is of such a degree that an initial failure (a reduction in yield) is not caused, the operation start-to-operation stop cycle causes a progressive failure, resulting in a lowered reliability. With the structure in the second embodiment, the diamond stylus will not come into contact with the Au film 18b in the primary cleavage operation either, thus preventing poor contact of the low reflectivity film and the high reflectivity film with the cleavage surfaces due to the Au film sticking or protruding as a flash, thus further improving the yield and the reliability compared to the structure in the first embodiment.

In addition, in the first embodiment, a gain waveguide type semiconductor laser device provided with an insulation stripe is combined with a structure wherein the Au film is removed only along the planes tangent to the sides of a semiconductor chip which are not coated with a low reflectivity film and a high reflectivity film, and in the second embodiment, an embedded stripe type semiconductor laser device is combined with a structure wherein the Au film is removed along all the planes tangent to the two sets of sides of a semiconductor chip. However, the present invention is not limited to the above two different combinations, and for a semiconductor laser device wherein a semiconductor chip is mounted in the junction-down style, a semiconductor chip having any structure can be combined with a structure wherein the Au film is removed only along the planes tangent to the sides which are not coated with a low reflectivity film and a high reflectivity film or a structure wherein the Au film is removed along all the planes tangent to the two sets of sides.

Figure 3A:
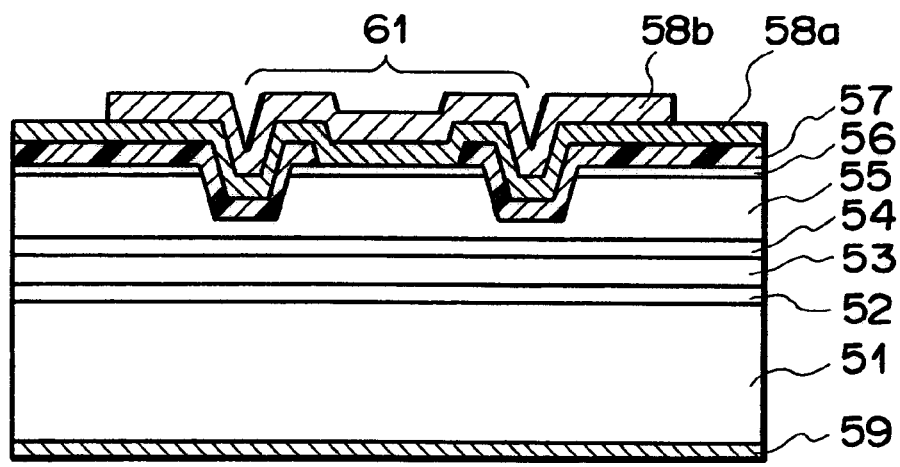
FIG. 3a and FIG. 3b show a set of drawings illustrating a ridge groove structure type semiconductor laser device.
Figure 3B:
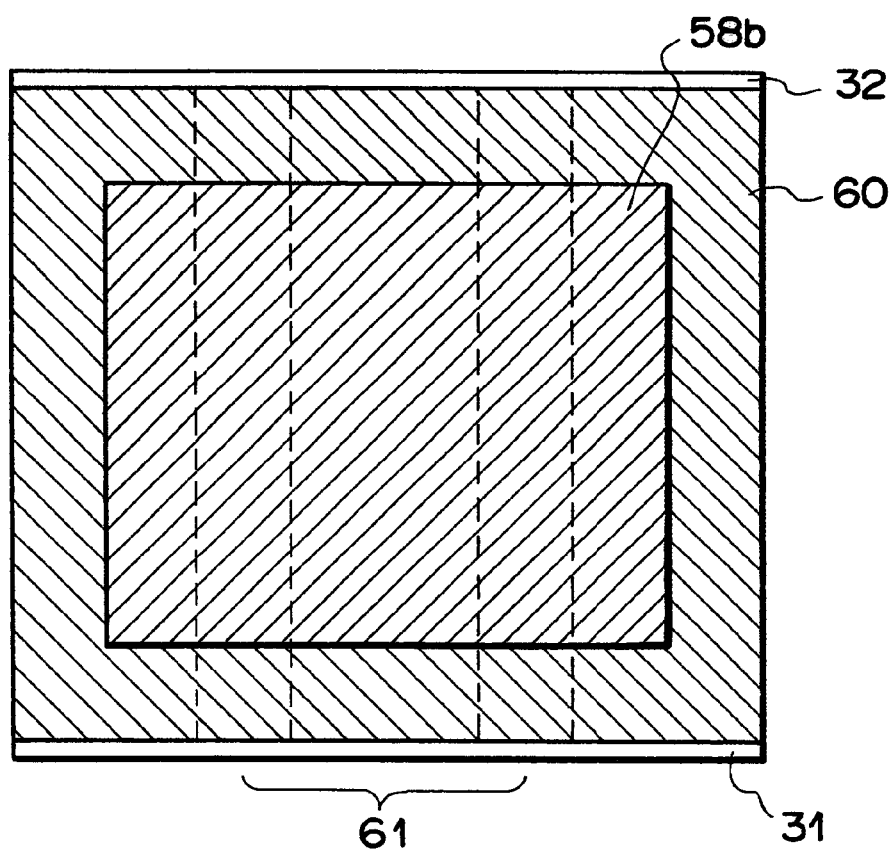

For example, the effects of the present invention can also be obtained if a ridge groove structure type semiconductor laser device as shown in FIG. 3a and FIG. 3b is combined with a structure wherein the Au film is removed along all the planes tangent to the two sets of sides. FIG. 3a a shows a schematic sectional drawing viewed from the side coated with a reflection film, of a semiconductor chip constituting the ridge groove type semiconductor laser device, and FIG. 3b shows a top view of the semiconductor chip.

In FIG. 3a and FIG. 3b, 51 denotes an n-GaAs substrate, 52 an n-GaAs buffer layer, 53 an n-AlGaAs cladding layer, 54 an undoped SCH active layer, 55 a p-AlGaAs cladding layer, 56 a p-GaAs cap layer, 57 an SiO$_2$ layer, and 61 a ridge structure area. The SiO$_2$ layer 57 covers the surface of the p-GaAs cap layer 56 and the sides and the bottoms of the ridge grooves, excluding a part of the top of the ridge structure area 61. The portion of the top of the ridge structure area 61 where the p-GaAs cap layer 56 is exposed and the surface of the SiO$_2$ layer 57 are covered with a p-side electrode 58. A second metallic layer 58a of the p-side electrode has a two-layer structure of Ti layer-Pt layer from the side whereon it is contacted with the p-GaAs cap layer 56, an Au layer 58b as a first metallic layer covering a part of the Pt layer. As can be seen from FIG. 3b, with the top of the semiconductor chip, the Au film 18b is removed along all the planes tangent to the two sets of sides, a surface 60 of the Pt film being exposed.

In the above description, n-GaAs is given as the substrate, but if p-GaAs is used, the effects of the present invention will not be changed, provided that all the conductivity types given are changed over from n to p or vice versa, and the sintering temperature for the p-side electrode is set at a value lower than the sintering temperature for the n-side electrode.

Figure 4:
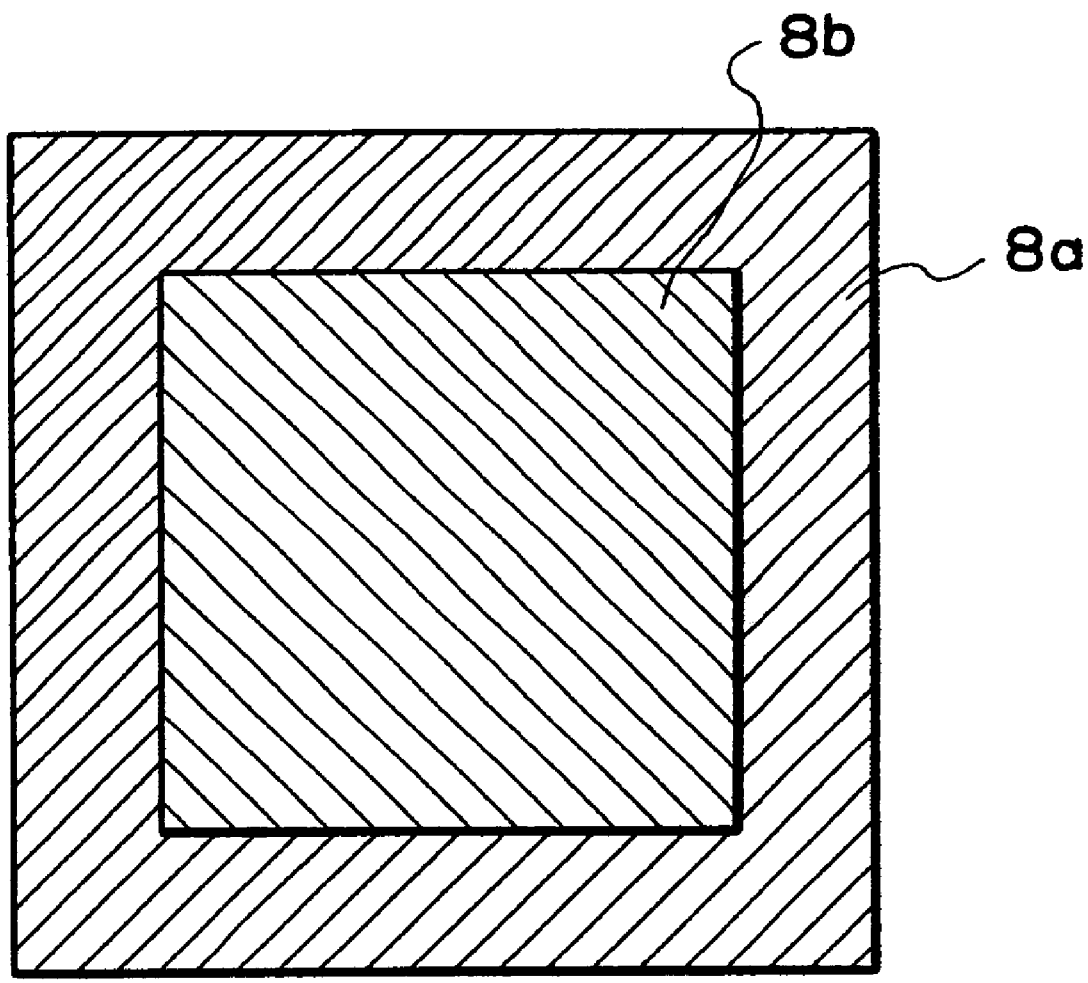
FIG. 4 shows a drawing illustrating a semiconductor light emitting diode device as an embodiment of the present invention, being a top view of a semiconductor chip constituting the diode device.

For a semiconductor chip having all the sides exposed, and having a p-n junction, as is the case with such a device as a GaAsP light emitting diode (LED), providing the entire area between the outer edge of an Au layer 8b, which is a first metallic layer of a p-side electrode 8, and the outer edge of the top of the chip as the exposed surface of a Ti layer 8a, which is a second metallic layer, as shown in FIG. 4 eliminates the possibility of the diamond saw touching the Au layer 8b in the dividing operation, exactly the same effects are obtained as those obtained in the above embodiment.

As described above, according to the structures of the present invention, an area where the Au film, which is the first metallic layer, does not exist can be provided along the plane tangent to, at least, the side where the p-n junction is exposed, of the semiconductor chip for a semiconductor light emitting device. Therefore, in dividing the semiconductor chips, the diamond stylus or diamond saw will not touch the Au film, and thus the Au film will not be spread. Thus, after the dividing operation, sticking of the Au layer to the side where the p-n junction is exposed or protruding of the layer as a flash from the side is not observed, and in anchoring, creep of the solder starting at a place where the Au film sticks to the side or protrudes as a flash from the side will not be caused, which results in a substantial reduction of the percentage of occurrence of p-n junction short-circuiting in junction-down mounting.

For a semiconductor laser device, by also providing areas where the Au film, which is the first metallic layer, is not applied, along the planes tangent to the sides which are coated with a high reflectivity film and a low reflectivity film, and where the p-n junction is not exposed in anchoring, sticking of the Au layer to the side or protruding of the layer as a flash from the side can be prevented, and thus the percentage of occurrence of poor contact of the semiconductor sides with the low reflectivity film and the high reflectivity film can be reduced, which results in the yield and the reliability being further improved.

Further, according to the structures of the present invention, the Au film, which is the first metallic layer, is provided, being in contact with a part of the top of the second metallic layer contacting the top of the semiconductor stack portion. This means that in the areas where the Au film is not applied, the top of the second metallic layer is exposed, and therefore, deterioration of the characteristics of a semiconductor light emitting device due to the solder coming into direct contact with the semiconductor stack top to heat it when anchoring the semiconductor chip is not caused.

The structures of the present invention have been obtained by application of the prior art.

The structures of the present invention have been intended to control the occurrence of p-n junction short-circuiting in mounting due to the high ductility of the Au film, which is the first metallic layer, and enhance the reliability. However, as a result of embodiment of the present invention, another effect has been obtained. In other words, with the conventional structure, the diamond stylus or the diamond saw touches the Au film in a dividing operation, and exerts a force on the Au film to push it in the lateral direction. At this time, a bulge may be produced on the Au film, because it has a high ductility, and this bulge has hindered tight contact of the Au layer with the solder when mounting in the junction-down style, resulting in a gap being produced at some parts between the semiconductor chip and the stem in some cases.

On the other hand, any semiconductor light emitting device generates heat during the light emitting operation, but it is designed so that this heat is carried to the outside through the stem, and the temperature of the semiconductor chip will not exceed the allowable limit. However, there has been a problem that, if the semiconductor chip is not in tight contact with the stem, with a gap existing, the heat generated by the semiconductor chip is not transferred to the stem at a sufficiently high speed, and instead builds up in the chip, and thus the chip temperature is increased to over the allowable limit value, which leads to a reduced service life.

According to the structures of the present invention, the diamond stylus or the diamond saw will not touch the Au film during dividing of semiconductor chips, and thus no bulge will be produced on the Au film, which has led to controlling the reduction in the service life of the device due to chip temperature rise.

In other words, the semiconductor light emitting device of the present invention provides a novel structure which can be easily realized, having allowed effective prevention of the reduction in yield and reliability when mounting in the junction-down style, which has been a problem with the conventional structure.

What is claimed is:

1. A semiconductor light emitting device comprising:

a semiconductor stack portion wherein a plurality of semiconductor layers are stacked;

a second metallic layer which contacts at least a part of a top of the semiconductor stack portion; and a first metallic layer which contacts the second metallic layer;

wherein at least a part of an outer edge of said first metallic layer is located inside of an outer edge of said second metallic layer, and wherein an area where a top of said second metallic layer is exposed is provided outside of an outer edge of said first metallic layer.

2. A semiconductor light emitting device according to claim 1, wherein said second metallic layer comprises a high-melting point metal.

3. A semiconductor light emitting device according to claim 1, wherein said second metallic layer is made by stacking a plurality of metallic layers, and at least the topmost layer of the stack metal layer is a high-melting point metallic layer.

4. A semiconductor light emitting device according to claim 2 or claim 3, wherein said high-melting point metal is any one of platinum, titanium, molybdenum, and tungsten.

\* \* \* \* \*